(12) United States Patent
Loy et al.

(10) Patent No.: US 11,444,125 B2
(45) Date of Patent: Sep. 13, 2022

(54) MEMORY DEVICES AND METHODS OF FORMING MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 226 days.

(21) Appl. No.: 16/903,503

(22) Filed: Jun. 17, 2020

(65) Prior Publication Data

US 2021/0399055 A1 Dec. 23, 2021

(51) Int. Cl.
*H01L 27/24* (2006.01)
*H01L 45/00* (2006.01)
*G11C 11/56* (2006.01)
*G11C 13/00* (2006.01)

(52) U.S. Cl.
CPC ...... *H01L 27/2472* (2013.01); *G11C 11/5614* (2013.01); *G11C 11/5685* (2013.01); *G11C 13/0069* (2013.01); *H01L 45/08* (2013.01); *H01L 45/085* (2013.01); *H01L 45/1266* (2013.01); *H01L 45/146* (2013.01); *H01L 45/1608* (2013.01); *H01L 45/1675* (2013.01); *G11C 2013/009* (2013.01)

(58) Field of Classification Search
CPC ............... H01L 27/2472; H01L 45/122; H01L 45/1233; H01L 45/124; H01L 45/1253–1273
See application file for complete search history.

(56) References Cited

U.S. PATENT DOCUMENTS

2019/0272874 A1 9/2019 Dananjaya et al.

OTHER PUBLICATIONS

Van Den Hurk et al., "Ag/GeSx/Pt-based complementary resistive switches for hybrid CMOS/Nanoelectronic logic and memory architectures", Scientific Reports, 2013, pp. 1-5, vol. 3.
Linn et al., "Compact modeling of CRS devices based on ECM cells for memory, logic and neuromorphic applications", Nanotechnology, 2013, 12 pages, vol. 24, IOP Publishing Ltd.

*Primary Examiner* — Amar Movva
(74) *Attorney, Agent, or Firm* — Viering Jentschura & Partner MBB (57) ABSTRACT

A memory device may be provided, including first, second and third electrodes, first and second mask elements and a switching layer. The first mask element may be arranged over a portion of and laterally offset from the first electrode. The second electrode may be arranged over the first mask element. The second mask element may be arranged over the second electrode. The third electrode may be arranged over a portion of and laterally offset from the second mask element. The switching layer may be arranged between the first electrode and the third electrode, along a first side surface of the first mask element, a first side surface of the second electrode and a first side surface of the second mask element.

20 Claims, 8 Drawing Sheets

MEMORY DEVICES AND METHODS OF FORMING MEMORY DEVICES

TECHNICAL FIELD

The present disclosure relates generally to memory devices, and methods of forming the memory devices.

BACKGROUND

Non-volatile memory cells are often used in consumer electronic products such as smart phones and tablets. One type of non-volatile memory cell is the resistive memory cell that typically uses a switching layer sandwiched between two electrodes. The switching layer is normally insulating. However, upon application of a set voltage difference between the electrodes, conducting filaments may be formed within the switching layer and the switching layer thus becomes conductive via the conducting filaments. The switching layer can be made insulating again by applying a reset voltage difference to the electrodes to break the conducting filaments. A typical resistive memory cell can switch between states based on the resistance of the switching layer. When the switching layer is insulating, the switching layer has a high resistance, and the resistive memory cell may be referred to as being in a high resistance state (HRS). The resistance of the switching layer in this state may be referred to as the HRS resistance of the cell. When the switching layer is conductive, the switching layer has a low resistance and the resistive memory cell may be referred to as being in a low resistance state (LRS). The resistance of the switching layer in this state may be referred to as the LRS resistance of the cell.

Several resistive memory cells are switchable between only two states. Although a plurality of memory cells can be combined to provide a memory device switchable between more than two states, many of such current memory devices are large and costly to manufacture. Therefore, it is desirable to provide an improved memory device that is not only switchable between more than two states, but is also more compact and less costly to manufacture as compared to currently available memory devices.

SUMMARY

According to various non-limiting embodiments, there may be provided a memory device including a first electrode, a first mask element arranged over a portion of and laterally offset from the first electrode, a second electrode arranged over the first mask element, a second mask element arranged over the second electrode, a third electrode arranged over a portion of and laterally offset from the second mask element, and a switching layer arranged between the first electrode and the third electrode, along a first side surface of the first mask element, a first side surface of the second electrode and a first side surface of the second mask element.

According to various non-limiting embodiments, there may be provided a method of fabricating a memory device. The method may include forming a first electrode, forming a first mask element over a portion of the first electrode, where the first mask element may be laterally offset from the first electrode, forming a second electrode over the first mask element, forming a second mask element over the second electrode, forming a third electrode over a portion of the second mask element, where the third electrode may be laterally offset from the second mask element, and forming a switching layer between the first electrode and the third electrode, along a first side surface of the first mask element, a first side surface of the second electrode and a first side surface of the second mask element.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

The embodiments generally relate to semiconductor devices. More particularly, some embodiments relate to memory devices. For example, some embodiments may relate to non-volatile memory devices such as resistive random access memory (RRAM) devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1:
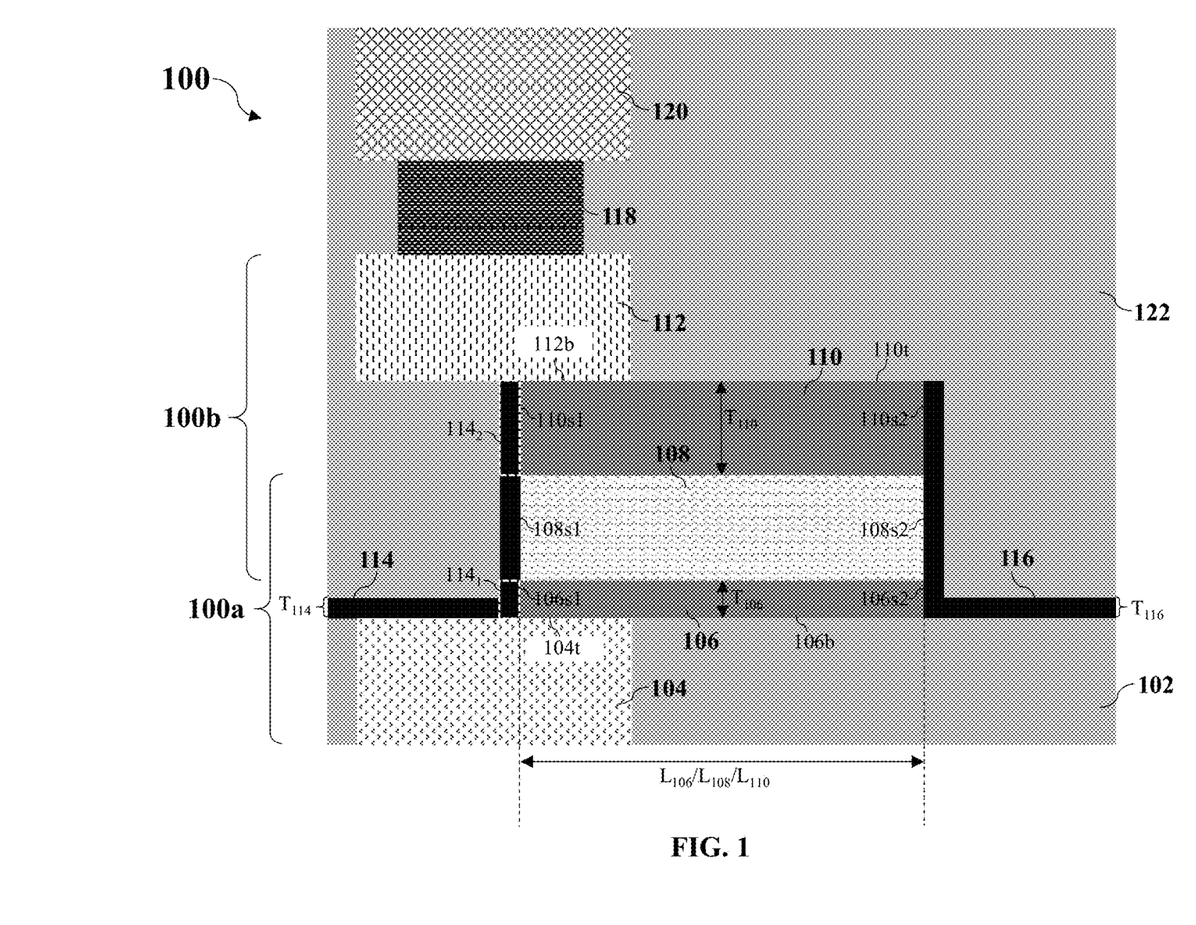
FIG. 1 shows a simplified cross-sectional view of a memory device according to various non-limiting embodiments.

FIG. 1 shows a simplified cross-sectional view of a memory device 100 according to various non-limiting embodiments. The memory device 100 may be a RRAM device and may have a 1R structure.

As shown in FIG. 1, the memory device 100 may include a base layer 102. The base layer 102 may include insulating material, such as, but not limited to, silicon oxide, silicon dioxide, silicon nitride, or combinations thereof. For example, the base layer 102 may be an inter-layer dielectric (ILD) layer.

The memory device 100 may further include a first electrode 104 arranged at least partially within the base layer 102. In addition, the memory device 100 may include a first mask element 106, a second electrode 108, a second mask element 110 and a third electrode 112. The first mask element 106 may be arranged over the first electrode 104 and the base layer 102; the second electrode 108 may be arranged over the first mask element 106; the second mask element 110 may be arranged over the second electrode 108; and the third electrode 112 may be arranged over the second mask element 110.

Referring to FIG. 1, the first electrode 104 and the first mask element 106 may be laterally offset from each other. Similarly, the third electrode 112 and the second mask element 110 may be laterally offset from each other. "Laterally offset" as used herein refers to a partial, but not a full overlap, of two elements. For example, the first mask element 106 may be arranged over a portion of the first electrode 104 and the first electrode 104 may be arranged under a portion of the first mask element 106. In other words, the first mask element 106 may partially (and not fully) overlap the first electrode 104 and the first electrode 104 may partially (and not fully) overlap the first mask element 106. Similarly, the third electrode 112 may be arranged over a portion of the second mask element 110 and the second mask element 110 may be arranged under a portion of the third electrode 112. In other words, the third electrode 112 may partially (and not fully) overlap the second mask element 110 and the second mask element 110 may partially (and not fully) overlap the third electrode 112. In particular, as shown in FIG. 1, a bottom surface 106b of the first mask element 106 may partially overlap and optionally directly contact the first electrode 104. Similarly, a top surface 110t of the second mask element 110 may partially overlap and optionally directly contact the third electrode 112.

Further, as shown in FIG. 1, the second electrode 108 may adjoin (or in other words, may directly contact) the first mask element 106, and the second mask element 110 may adjoin the second electrode 108. The first mask element 106, the second electrode 108 and the second mask element 110 may each include a first side surface 106s1, 108s1, 110s1 and a second side surface 106s2, 108s2, 110s2 facing an opposite direction from the first side surface 106s1, 108s1, 110s1. As shown in FIG. 1, the first side surfaces 106s1, 108s1, 110s1 of the first mask element 106, the second electrode 108 and the second mask element 110 may be substantially vertically aligned. A length $L_{106}$ of the first mask element 106, a length $L_{108}$ of the second electrode 108 and a length $L_{110}$ of the second mask element 110 may be approximately equal. Accordingly, the second side surfaces 106s2, 108s2, 110s2 of the first mask element 106, the second electrode 108, and the second mask element 110 may also be substantially vertically aligned.

In addition, as shown in FIG. 1, a thickness $T_{110}$ of the second mask element 110 may be greater than a thickness $T_{106}$ of the first mask element 106. In various non-limiting embodiments, the thickness $T_{110}$ of the second mask element 110 may be at least two times greater than the thickness $T_{106}$ of the first mask element 106. Further, the thickness $T_{110}$ of the second mask element 110 may be less than or equal to 50 nm. For example, the thickness $T_{106}$ of the first mask element 106 may range from about 5 nm to about 10 nm, and the thickness $T_{110}$ of the second mask element 110 may range from about 10 nm to about 20 nm. However, a thickness $T_{110}$ of the second mask element 110 may alternatively be approximately equal to a thickness $T_{106}$ of the first mask element 106. Each of the first and second mask elements 106, 110 may be referred to as a hard mask and may include insulating mask material such as, but not limited to, various oxides and nitrides, for example, silicon oxide (SiO$_x$), tantalum oxide (TaO$_x$), aluminium oxide (AlO$_x$), silicon nitride (Si$_3$N$_4$), or combinations thereof.

Referring to FIG. 1, the memory device 100 may include a switching layer 114 arranged between the first electrode 104 and the third electrode 112 over the base layer 102. In particular, the switching layer 114 may be arranged to extend substantially planar between the top surface 104t of the first electrode 104 and the bottom surface 112b of the third electrode 112, along the substantially vertically aligned first side surfaces 106s1, 108s1, 110s1 of the first mask element 106, the second electrode 108, and the second mask element 110. As shown in FIG. 1, the switching layer 114 may further extend horizontally over the top surface 104t of the first electrode 104 away from the first mask element 106. Accordingly, the first mask element 106 may overlap with a portion of the top surface 104t of the first electrode 104, and the switching layer 114 may overlap with the entire remaining portion of the top surface 104t of the first electrode 104. The switching layer 114 may be in the form of a thin liner having a uniform thickness $T_{114}$. The thickness $T_{114}$ of the switching layer 114 may be less than 5 nm. For example, the thickness $T_{114}$ of the switching layer 114 may range from about 3 nm to about 5 nm.

Referring to FIG. 1, the memory device 100 may also include a further switching layer 116 arranged over the base layer 102. The further switching layer 116 may be arranged to extend substantially planar along the substantially vertically aligned second side surfaces 106s2, 108s2, 110s2 of the first mask element 106, the second electrode 108, and the second mask element 110. The further switching layer 116 may also extend horizontally over the base layer 102 away from the first mask element 106. The further switching layer 116 may similarly be in the form of a thin liner having a uniform thickness $T_{116}$. The thickness $T_{116}$ of the further switching layer 116 may be approximately equal to the thickness $T_{114}$ of the switching layer 114, and may be less than or equal to 5 nm. For example, the thickness $T_{116}$ of the further switching layer 116 may range from about 3 nm to about 5 nm. In the memory device 100, the further switching layer 116 may be optional (although, the fabrication process of the memory device 100 may be less complex if the further switching layer 116 is included in the device 100).

As shown in FIG. 1, the first and second electrodes 104, 108 and a first part $114_1$ of the switching layer 114 (between the first electrode 104 and the second electrode 108) may form a first memory cell 100a; whereas, the second and third electrodes 108, 112 and a second part $114_2$ of the switching layer 114 (between the second electrode 108 and the third electrode 112) may form a second memory cell 110b. In other words, the memory device 100 may include a first memory cell 100a including the first and second electrodes 104, 108, and a second memory cell 100b including the second and third electrodes 108, 112, where the second memory cell 100b may be arranged above the first memory cell 100a.

The first memory cell 110a and the second memory cell 110b may be different types of memory cells, and the first electrode 104 and the third electrode 112 may include different materials. In particular, the first memory cell 110a may be an oxide-based memory cell and the second memory cell 110b may be a conductive-bridge memory cell. Accordingly, the HRS resistance of the second memory cell 100b may be higher than the HRS resistance of the first memory cell 100a. Each memory cell 100a, 100b may be a RRAM cell. For example, the first memory cell 100a may be an oxide-based resistive random access memory (OxRAM) cell, and the second memory cell 100b may be a conductive-bridge random access memory (CBRAM) cell.

"Oxide-based memory cell", as used herein, means that the memory cell may switch between states based on the formation and rupture of conducting filaments that may include oxygen ion-related defects (such as oxygen vacancies). In an oxide-based memory cell, one of the electrodes (the "oxygen scavenging electrode") may be oxidizable to form a layer of oxygen ion-related defects. These oxygen ion-related defects may migrate to the other electrode (the "inert" electrode) when a set voltage difference is applied between the electrodes. An oxide-based memory cell may alternatively be referred to as an anionic filament memory cell or a valence change memory (VCM) cell.

"Conductive-bridge memory cell", as used herein, means that the memory cell may switch between states based on the formation and rupture of conducting filaments that may include metal atoms or molecules. The metal atoms or molecules may be formed from the oxidation of one of the electrodes (the "active electrode") and may migrate to the other electrode (the "inert" electrode) when a set voltage difference is applied between the electrodes. A conductive-bridge memory cell may alternatively be referred to as a cationic filament memory cell or an electrochemical metallization (ECM) cell.

In the memory device 100, the second electrode 108 may include an inert electrode of both the first memory cell 100a and the second memory cell 100b. Further, the first electrode 104 may include an oxygen scavenging electrode of the first memory cell 100a, and the third electrode 112 may include an active electrode of the second memory cell 100b. The second electrode 108 may include a same material throughout and may include an inert electrode material, such as, but not limited to, platinum (Pt), ruthenium (Ru), gold (Au), alloys thereof, or combinations thereof. The first electrode 104 may include oxygen scavenging material, such as, but not limited to, titanium (Ti), tantalum (Ta), aluminum (Al), alloys thereof, or combinations thereof. The third electrode 112 may include metal material, such as, but not limited to, silver (Ag), copper (Cu), nickel (Ni), alloys thereof, or combinations thereof. The switching layer 114 may include a same material throughout. In other words, the first part $114_1$ and the second part $114_2$ of the switching layer 114 may include a same material. The further switching layer 116 may similarly include a same material throughout, and may include a same material as the switching layer 114. In particular, the switching layer 114 and the further switching layer 116 may include switching material, such as, but not limited to, dielectric material. For example, the switching layer 114 and the further switching layer 116 may include magnesium oxide (MgO), tantalum oxide (TaO$_2$), hafnium oxide (HfO$_2$), titanium oxide (TiO$_2$), aluminum oxide (AlO$_2$), silicon dioxide (SiO$_2$), or combinations thereof.

In addition, the memory device 100 may include a connector 118 and a contact 120. The connector 118 may electrically connect the contact 120 with the third electrode 112. In particular, the connector 118 may be arranged between and may adjoin the contact 120 and the third electrode 112. The memory device 100 may also include an insulating layer 122 arranged over the base layer 102. Each of the first and second mask elements 106, 110, the second and third electrodes 108, 112, the switching layer 114, the further switching layer 116, the connector 118 and the contact 120 may be arranged at least partially within the insulating layer 122. The connector 118 and the contact 120 may include conductive material, such as, but not limited to, aluminum, copper, tungsten, alloys thereof, or combinations thereof. For example, the contact 118 may include a conductive line, such as, but not limited to, a bit line of the memory device 100 and the connector 120 may include a conductive via. The insulating layer 122 may include insulating material, such as, but not limited to, silicon oxide, silicon dioxide, silicon nitride or combinations thereof. For example, the insulating layer 122 may be an inter-layer dielectric (ILD) layer.

FIGS. 2A to 2E show simplified cross-sectional views illustrating a method of forming the memory device 100 according to various non-limiting embodiments. For clarity of illustration, some reference numerals have been omitted from FIGS. 2A to 2E.

Figure 2A:
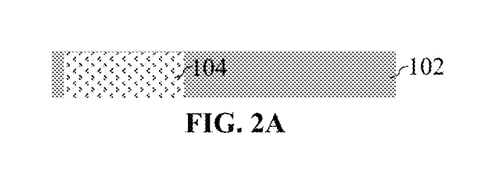
FIGS. 2A to 2E show simplified cross-sectional views illustrating a method of forming the memory device of FIG. 1 according to various non-limiting embodiments.

Referring to FIG. 2A, the method may include providing the base layer 102 and forming the first electrode 104 at least partially within the base layer 102. The first electrode 104 may be formed by depositing oxygen scavenging material over a surface above which the memory device 100 is to be formed, and then selectively etching the oxygen scavenging material using, for example, a photoresist mask. The base layer 102 may be provided by depositing insulating material over the first electrode 104, and planarizing the insulating material using, for example, a chemical mechanical planarization (CMP) process.

Figure 2B:
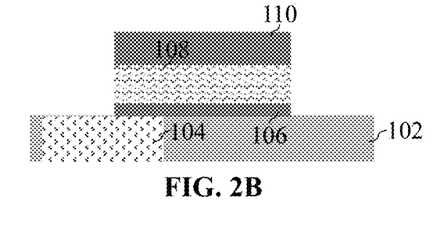

Referring to FIG. 2B, the method may further include forming the first mask element 106 over the first electrode 104 and the base layer 102, forming the second electrode 108 over the first mask element 106 and forming the second mask element 110 over the second electrode 108. The first mask element 106, the second electrode 108 and the second mask element 110 may be formed by depositing first mask material over the base layer 102, depositing inert electrode material over the first mask material, depositing second mask material over the inert electrode material, and thereafter, selectively etching the first mask material, the inert electrode material, and the second mask material. The remaining first mask material, inert electrode material, and second mask material may form the first mask element 106, the second electrode 108, and the second mask element 110, respectively.

Figure 2C:
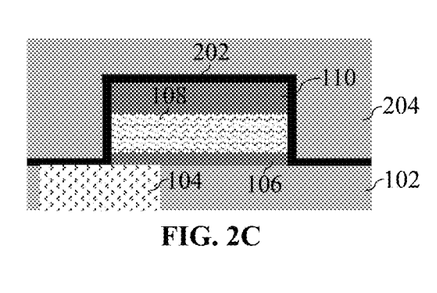
Figure 2D:
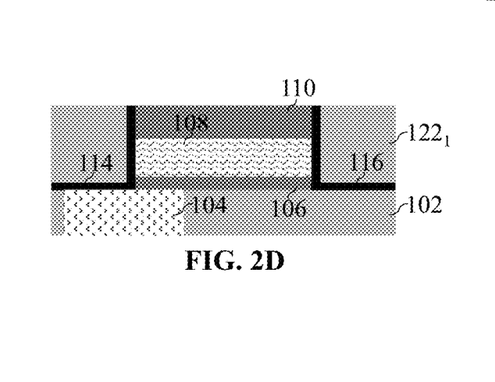

Referring to FIGS. 2C and 2D, the method may further include forming the switching layer 114, the further switching layer 116 and a first part $122_1$ of the insulating layer 122. As shown in FIG. 2C, the method may include depositing a thin liner of switching material 202 over the base layer 102 and the second mask element 110, and also, along the first and second side surfaces $106s1$, $108s1$, $110s1$, $106s2$, $108s2$, $110s2$ of the first mask element 106, the second electrode 108 and the second mask element 110. The method may additionally include depositing insulating material 204 over the switching material 202. As shown in FIG. 2D, the method may further include removing a portion of the switching material 202 and a portion of the insulating material 204 above the second mask element 110 to form the switching layer 114, the further switching layer 116 and the first part $122_1$ of the insulating layer 122 (which, as mentioned above, may be an ILD layer).

Figure 2E:
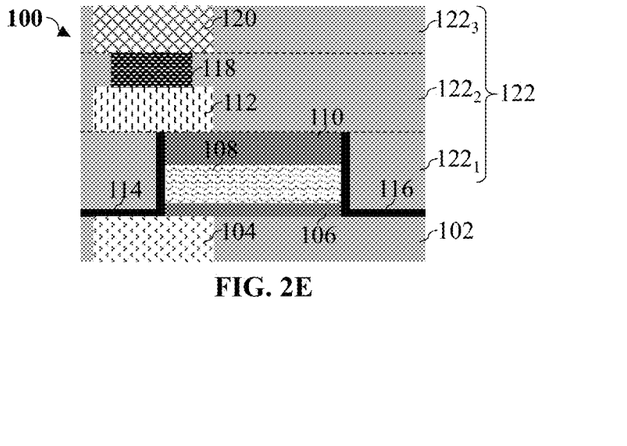

Referring to FIG. 2E, the method may include forming the third electrode 112, the connector 118 and the contact 120, and second and third parts $122_2$, $122_3$ of the insulating layer 122. The third electrode 112 may be formed by depositing active electrode material over the first part $122_1$ of the insulating layer 122 and selectively etching the active electrode material. Insulating material may then be deposited over the third electrode 112 to form a second part $122_2$ of the insulating layer 122. The connector 118 and the contact 120 may then be formed using any process as known to one skilled in the art, such as, but not limited to, a back-end-of-line (BEOL) process. For example, the second part $122_2$ of the insulating layer 122 may be etched to form an opening and the opening may be filled with conductive material to form the connector 118. The third part $122_3$ of the insulating layer 122 may then be formed by depositing insulating material over the second part $122_2$ of the insulating layer 122, and the contact 120 may be formed by etching the third part $122_3$ of the insulating layer 122 to form an opening and depositing conductive material into the opening.

The above described order for the method is only intended to be illustrative, and the method is not limited to the above specifically described order unless otherwise specifically stated.

Figure 3A:
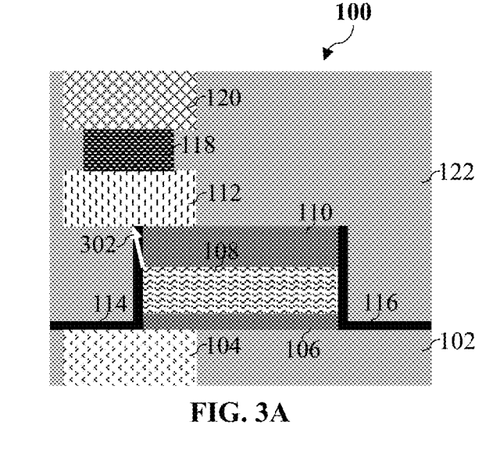
FIGS. 3A to 3C show simplified cross-sectional views illustrating the memory device of FIG. 1 in use.
Figure 3B:
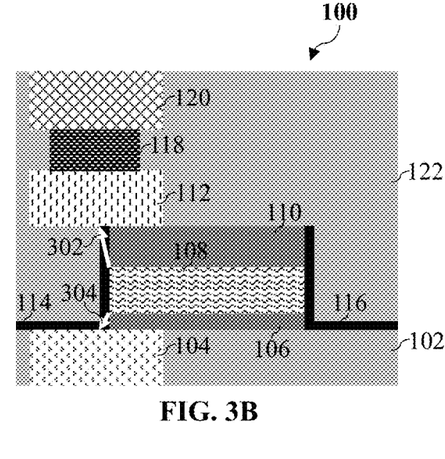
Figure 3C:
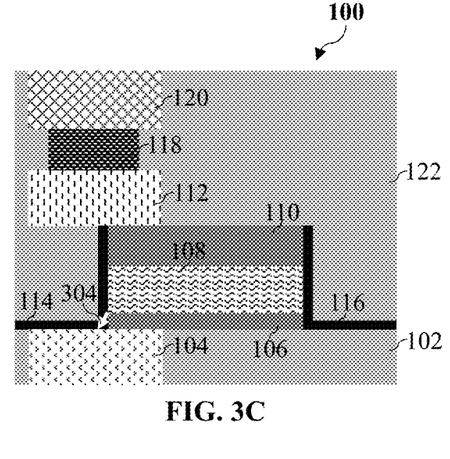
Figure 4:
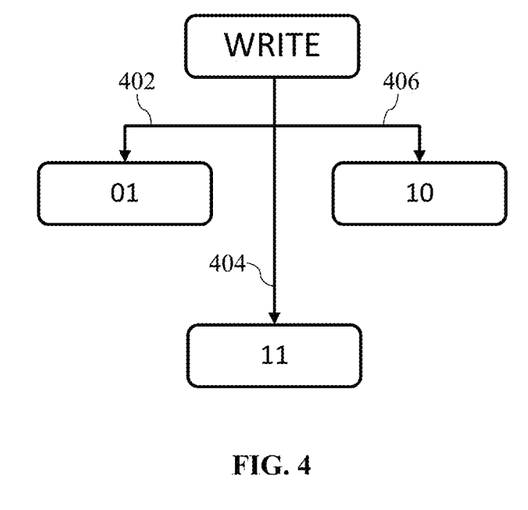
FIG. 4 shows a chart illustrating different states of the memory device of FIG. 1 when the memory device is in use.

FIGS. 3A to 3C show simplified cross-sectional views illustrating the memory device 100 in use. Again, for clarity of illustration, some reference numerals have been omitted from FIGS. 3A to 3C. FIG. 4 shows a chart illustrating different states of the memory device 100 when the memory device 100 is in use. As shown in FIG. 4, each state may be expressed in the form of "XY" where each of "X" and "Y" may be 0 or 1, and where "X" indicates the state of the first memory cell 100a and "Y" indicates the state of the second memory cell 100b above the first memory cell 100a.

Initially, the switching layer 114 may be entirely insulating and the memory device 100 may be referred to as being in the "00" state or in other words, the pristine state.

Referring to FIG. 3A and FIG. 4, a first write operation 402 may be performed on the memory device 100 by applying a first write voltage difference ($V_{01}$) between the first electrode 104 and the third electrode 112. As shown in FIG. 3A, this may form conducting filaments 302 between the second electrode 108 and the third electrode 112. The conducting filaments 302 may be formed and confined within the second part $114_2$ of the switching layer 114. Thus, the memory device 100 may be written to the "01" state, where the first memory cell 100a may remain in the HRS ("0") state and the second memory cell 100b may be set to the LRS ("1") state. Accordingly, an overall resistance of the memory device 100 may depend on the HRS resistance of the first memory cell 100a.

Referring to FIG. 3B and FIG. 4, a second write operation 404 may be performed on the memory device 100 by applying a second write voltage difference ($V_{11}$) between the first electrode 104 and the third electrode 112. As shown in FIG. 3B, this may form conducting filaments 302 between the second electrode 108 and the third electrode 112, and also, conducting filaments 304 between the first electrode 104 and the second electrode 108. The conducting filaments 302 may be formed and confined within the second part $114_2$ of the insulating layer 114; whereas, the conducting filaments 304 may be formed and confined within the first part $114_1$ of the switching layer 114. In other words, the memory device 100 may be written to the "11" state, where both the first and second memory cells 100a, 100b may be set to the LRS ("1") state.

Referring to FIG. 3C and FIG. 4, a third write operation 406 may be performed on the memory device 100 by applying a third write voltage difference ($V_{10}$) between the first electrode 104 and the third electrode 112. As shown in FIG. 3C, this may form conducting filaments 304 between the first electrode 104 and the second electrode 108. The conducting filaments 304 may be formed and confined within the first part $114_1$ of the switching layer 114. In other words, the memory device 100 may be written to the "10" state, where the first memory cell 100a may be set to the LRS ("1") state and the second memory cell 100b may remain in the HRS ("0") state. Accordingly, an overall resistance of the memory device 100 may depend on the HRS resistance of the second memory cell 100a.

To read the memory device 100, a read voltage difference ($V_{read}$) may be applied between the first and third electrodes 104, 112 and a current passing through the memory device 100 may be determined. This current may indicate the state of the memory device 100.

The first, second and third write voltage differences ($V_{01}$, $V_{10}$, $V_{11}$) may be related to first, second, third and fourth threshold voltages $VTH1_{100}$, $VTH2_{100}$, $VTH3_{100}$, $VTH4_{100}$. The polarities of the third and fourth threshold voltages $VTH3_{100}$, $VTH4_{100}$ may be opposite to the polarities of the first and second threshold voltages $VTH1_{100}$, $VTH2_{100}$. For example, the third and fourth threshold voltages $VTH3_{100}$, $VTH4_{100}$ may be negative (with the magnitude of $VTH4_{100}$ being greater than that of $VTH3_{100}$ i.e. $|VTH4_{100}|>|VTH3_{100}|$ or in other words, with $VTH4_{100}$ being more negative than $VTH3_{100}$); whereas, the first and second threshold voltages $VTH1_{100}$, $VTH2_{100}$ may be positive (with the magnitude of $VTH2_{100}$ being greater than that of $VTH1_{100}$ i.e. $|VTH2_{100}|>|VTH1_{100}|$ or in other words, with $VTH2_{100}$ being more positive than $VTH1_{100}$).

In particular, the first write voltage difference ($V_{01}$) may be negative and lower (in other words, more negative) than the fourth threshold voltage $VTH4_{100}$; the third write voltage difference ($V_{10}$) may be positive and greater than the second threshold voltage $VTH2_{100}$; and the second write voltage difference ($V_{11}$) may be positive and between the first and second threshold voltages $VTH1_{100}$, $VTH2_{100}$, or negative and between the third and fourth threshold voltages $VTH3_{100}$, $VTH4_{100}$. In other words, $V_{01}<VTH4_{100}$; $V_{10}>VTH2_{100}$; $VTH1_{100}<V_{11}<VTH2_{100}$ or $VTH4_{100}<V_{11}<VTH3_{100}$.

One of the states "01" or "10" may be the overall "ON" state of the memory device 100; whereas, the other state "11" or "01" may be the overall "OFF" state of the memory device 100. In particular, the state associated with a lower overall resistance may be the overall "ON" state and the state associated with a higher overall resistance may be the overall "OFF" state.

As described above, the overall resistance of the memory device 100 may depend on the HRS resistance of the first memory cell 100a (the oxide-based memory cell) in the "01" state and on the HRS resistance of the second memory cell 100b (the conductive-based memory cell) in the "10" state. Since the second memory cell 100b may have a higher HRS resistance than the first memory cell 100a, the memory device 100 may have a lower overall resistance in the "01" state and a higher overall resistance in the "10" state. Accordingly, for the memory device 100, the "01" state may be the overall "ON" state and the "10" state may be the overall "OFF" state. An ON/OFF ratio of the memory device 100 may be determined as a ratio of the higher overall resistance in the overall "OFF" state to the lower overall resistance in the overall "ON" state. In exemplary non-limiting embodiments, the ON/OFF ratio of the memory device 100 may range from about 100 to about 10,000.

Although the memory device 100 is described above as being switchable between three states "01", "11", "10", the memory device 100 may be switchable between more than three states by adjusting the write voltage difference between the first and third electrodes 104, 112 accordingly. By configuring the thickness $T_{110}$ of the second mask element 110 (between the electrodes 108, 112 of the conductive-bridge memory cell) to be greater than the thickness $T_{106}$ of the first mask element 106 (between the electrodes 104, 108 of the oxide-based memory cell), the HRS resistance of the conductive-bridge memory cell may be increased and in turn, a difference between the HRS resistances of the memory cells 100a, 100b may be increased. Therefore, the ON/OFF ratio of the memory device 100 may be increased. With a higher ON/OFF ratio, a gap between the higher overall resistance and the lower overall resistance of the memory device 100 may be larger and thus, the memory device 100 may be switchable between a greater number of distinct states (each associated with a different overall resistance) within this gap. Further, as described above, the switching layer 114 may be formed by depositing a thin liner of switching material 202. Thus, the thickness $T_{114}$ of the switching layer 114 may not be limited by lithography technology. Accordingly, the conducting filaments 302, 304 may be formed within a thinner switching layer 114 and may be better confined. This may in turn help to reduce the stochasticity of the formation of the conducting filaments 302, 304 and the variability of the resistance of the switching layer 114 and the memory device 100, especially when the first or second memory cell 100a, 100b is in the HRS. Therefore, the cycle-to-cycle and device-to-device variability of the memory device 100 may be reduced. Further, by better confining the conducting filaments 302, 304, sizes of the conducting filaments 302, 304 (and thus, a resistance of the first or second part $114_1$, $114_2$ of the switching layer 114) may be better controlled. This can allow the memory device 100 to be switchable between more states that may be clearly distinguishable from one another. Accordingly, the storage capability of the memory device 100 may increase.

Figure 5:
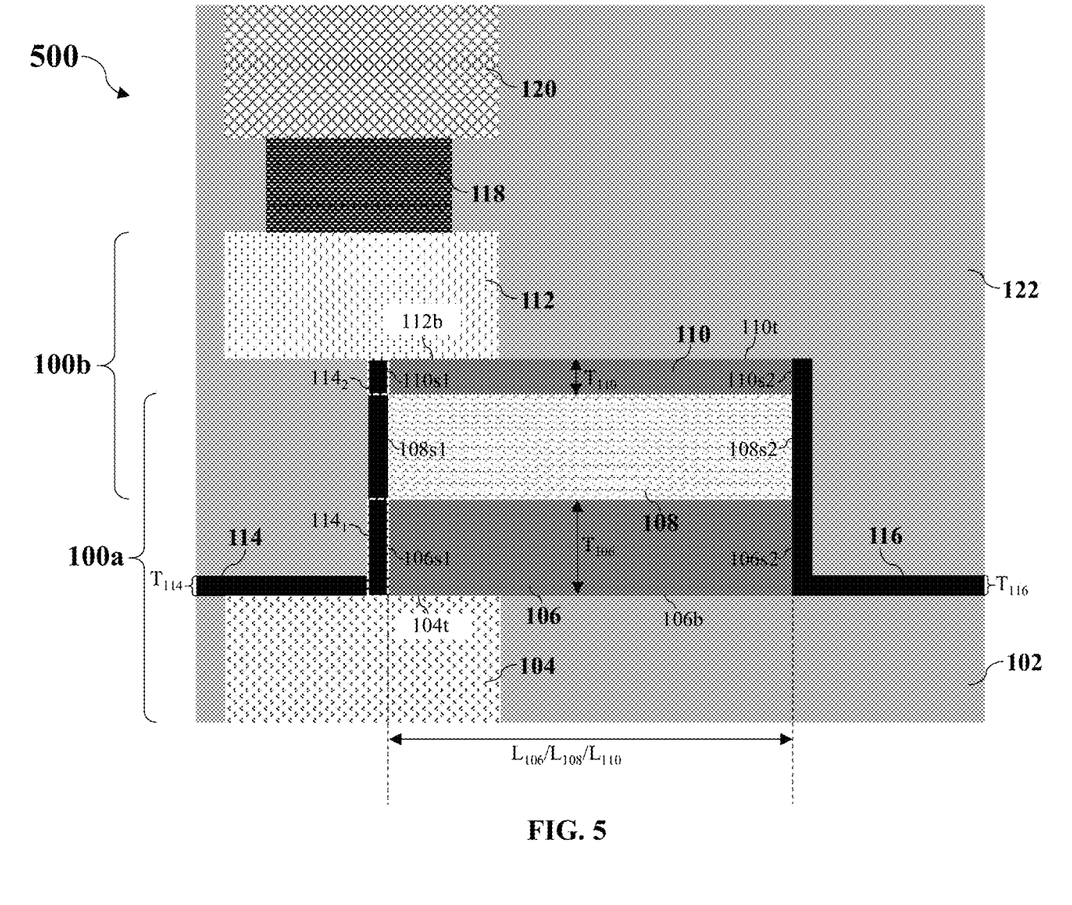
FIG. 5 shows a simplified cross-sectional view of a memory device according to alternative non-limiting embodiments.

FIG. 5 shows a memory device 500 according to alternative non-limiting embodiments. The memory device 500 is similar to the memory device 100, and thus, the common features are labelled with the same reference numerals and need not be discussed.

Similar to the memory device 100, the first memory cell 100a and the second memory cell 100b in the memory device 500 may be different types of memory cells, and the first electrode 104 and the third electrode 112 may include different materials. However, in the memory device 500, the first memory cell 100a may be a conductive-bridge memory cell and the second memory cell 100b may be an oxide-based memory cell. Accordingly, the HRS resistance of the first memory cell 100a may be greater than the HRS resistance of the second memory cell 100b. Further, a thickness $T_{106}$ of the first mask element 106 (between the electrodes 104, 108 of the conductive-bridge memory cell) may be greater than a thickness $T_{110}$ of the second mask element 110 (between the electrodes 108, 112 of the oxide-based memory cell). In various non-limiting embodiments, the thickness $T_{106}$ of the first mask element 106 may be at least two times greater than the thickness $T_{110}$ of the second mask element 110. Further, the thickness $T_{106}$ of the first mask element 106 may be less than or equal to 50 nm. For example, the thickness $T_{106}$ of the first mask element 106 may range from about 10 nm to about 20 nm, and the thickness $T_{110}$ of the second mask element 110 may range from about 5 nm to about 10 nm. However, the thicknesses $T_{106}$, $T_{110}$ of the first and second mask elements 106, 110 may alternatively be approximately equal.

In use, the memory device 500 may operate in a similar manner as the memory device 100. In particular, the memory device 500 may be switchable between states "01", "11", "10", when first, second and third write voltage differences $V_{01}$, $V_{11}$, $V_{10}$ are respectively applied between the first and third electrodes 104, 112 of the memory device 500. These write voltage differences ($V_{01}$, $V_{11}$, $V_{10}$) may also be related to first, second, third and fourth threshold voltages $VTH1_{500}$, $VTH2_{500}$, $VTH3_{500}$, $VTH4_{500}$. The polarities of the third and fourth threshold voltages $VTH3_{500}$, $VTH4_{500}$ may similarly be opposite to the polarities of the first and second threshold voltages $VTH1_{500}$, $VTH2_{500}$. For example, the third and fourth threshold voltages $VTH3_{500}$, $VTH4_{500}$ may be negative (with $VTH4_{500}$ being more negative than $VTH3_{500}$); whereas, the first and second threshold voltages $VTH1_{500}$, $VTH2_{500}$ may be positive (with $VTH2_{500}$ being more positive than $VTH1_{500}$). Further, the threshold voltages $VTH1_{500}$-$VTH4_{500}$ for the device 500 may be different from the threshold voltages $VTH1_{100}$-$VTH4_{100}$ for the device 100.

In particular, for the memory device 500, the first write voltage difference ($V_{01}$) may be positive and greater than the second threshold voltage $VTH2_{500}$; the third write voltage difference ($V_{10}$) may be negative and lower (in other words, more negative) than the fourth threshold voltage $VTH4_{500}$; and the second write voltage difference ($V_{11}$) may be positive and between the first and second threshold voltages $VTH1_{500}$, $VTH2_{500}$, or negative and between the third and fourth threshold voltages $VTH3_{500}$, $VTH4_{500}$. In other words, $V_{01} > VTH2_{500}$; $V_{10} < VTH4_{500}$; $VTH1_{500} < V_{11} < VTH2_{500}$ or $VTH4_{500} < V_{11} < VTH3_{500}$.

In the "01" state, the overall resistance of the memory device 500 may similarly depend on the HRS resistance of the first memory cell 100a, and in the "10" state, the overall resistance of the memory device 500 may similarly depend on the HRS resistance of the second memory cell 100b. However, as compared to the memory device 100, the HRS resistance of the first memory cell 100a may instead be greater than the HRS resistance of the second memory cell 100b. Thus, the memory device 500 may have a lower overall resistance in the "10" state and a higher overall resistance in the "01" state. Accordingly, for the memory device 500, the "01" state may be the overall "OFF" state and the "10" state may be the overall "ON" state.

As described above, in the memory devices 100, 500, the first and second memory cells 100a, 100b may be different types of memory cells, where the first and third electrodes 104, 112 may include different materials. However, the first and second memory cells 100a, 100b may alternatively be a same type of memory cell including a conductive-bridge memory cell or an oxide-based memory cell, and the first and third electrodes 104, 112 may include a same material.

In this alternative non-limiting embodiment, the memory device may similarly be switchable between states "01", "11", "10", when first, second and third write voltage differences $V_{01}$, $V_{11}$, $V_{10}$ are respectively applied between the first and third electrodes 104, 112 of the memory device. The first, second and third write voltage differences ($V_{01}$, $V_{11}$, $V_{10}$) may also be related to first, second, third and fourth threshold voltages $VTH1_{EQ}$, $VTH2_{EQ}$, $VTH3_{EQ}$, $VTH4_{EQ}$. Similarly, the polarities of the third and fourth threshold voltages $VTH3_{EQ}$, $VTH4_{EQ}$ may be opposite to the polarities of the first and second threshold voltages $VTH1_{EQ}$, $VTH2_{EQ}$. For example, the third and fourth threshold voltages $VTH3_{EQ}$, $VTH4_{EQ}$ may be negative (with $VTH4_{EQ}$ being more negative than $VTH3_{EQ}$); whereas, the first and second threshold voltages $VTH1_{EQ}$, $VTH2_{EQ}$ may be positive (with $VTH2_{EQ}$ being more positive than $VTH1_{EQ}$). Further, the threshold voltages $VTH1_{EQ}$-$VTH4_{EQ}$ for this memory device may be different from the threshold voltages $VTH1_{100}$-$VTH4_{100}$ and $VTH1_{500}$-$VTH4_{500}$ for the memory devices 100, 500.

In particular, the first write voltage difference ($V_{01}$) may be positive and lower than the first threshold voltage $VTH1_{EQ}$, or negative and lower (in other words, more negative) than the fourth threshold voltage $VTH4_{EQ}$. The second write voltage difference ($V_{10}$) may be positive and greater than the second threshold voltage $VTH2_{EQ}$, or negative and greater (in other words, less negative) than the third threshold voltage $VTH3_{EQ}$. The third write voltage difference ($V_{11}$) may be positive and between the first and second threshold voltages $VTH1_{EQ}$, $VTH2_{EQ}$, or negative and between the third and fourth threshold voltages $VTH3_{EQ}$, $VTH4_{EQ}$. In other words, $0 < V_{01} < VTH1_{EQ}$ or $V_{01} < VTH4_{EQ}$; $V_{10} > VTH2_{EQ}$ or $VTH3_{EQ} < V_{10} < 0$; $VTH1_{EQ} < V_{11} < VTH2_{EQ}$ or $VTH4_{EQ} < V_{11} < VTH3_{EQ}$.

Since the first and second memory cells 100a, 100b may be of a same type, if the thicknesses $T_{106}$, $T_{110}$ of the first and second mask elements 106, 110 are approximately equal, the HRS resistances of these memory cells 100a, 100b may be approximately equal. In this case, the memory device may have approximately a same overall resistance in the "10" state and in the "01" state. Therefore, any one of the "10" and "01" states may be the overall "ON" state and the other may be the overall "OFF" state.

Alternatively, one of the thicknesses $T_{106}$, $T_{110}$ of the first and second mask elements 106, 108 may be greater. In this case, the memory device may similarly be switchable between states "01", "11", "10", when first, second and third write voltage differences $V_{01}$, $V_{11}$, $V_{10}$ are respectively applied between the first and third electrodes 104, 112 of the memory device. Further, the first, second and third write voltage differences $V_{01}$, $V_{11}$, $V_{10}$ of this memory device may also be related to first to fourth threshold voltages $VTH1_{UNEQ}$, $VTH2_{UNEQ}$, $VTH3_{UNEQ}$, $VTH4_{UNEQ}$ in a similar manner as that described above for when the thicknesses $T_{106}$, $T_{110}$ are approximately equal. However, while $VTH1_{UNEQ}$ and $VTH3_{UNEQ}$ may be approximately equal to $VTH1_{EQ}$ and $VTH3_{EQ}$ respectively, $VTH2_{UNEQ}$ may be higher (in other words, more positive) than $VTH2_{EQ}$ and $VTH4_{UNEQ}$ may be lower (in other words, more negative) than $VTH4_{EQ}$. As stated above, the state ("01" or "10") in which the overall resistance of the memory device is lower may be the overall "ON" state and the other state ("01" or "10") may be the overall "OFF" state. Accordingly, if the thickness $T_{106}$ of the first mask element 106 is greater than the thickness $T_{110}$ of the second mask element 110, the HRS resistance of the first memory cell 100a may be greater than the HRS resistance of the second memory cell 100b, and thus, the "01" state may be the overall "OFF" state and the "10" state may be the overall "ON" state. On the other hand, if the thickness $T_{110}$ of the second mask element 110 is greater than the thickness $T_{106}$ of the first mask element 106, the HRS resistance of the second memory cell 100b may be greater than the HRS resistance of the first memory cell 100a, and thus, the "01" state may be the overall "ON" state and the "10" state may be the overall "OFF" state.

Figure 6:
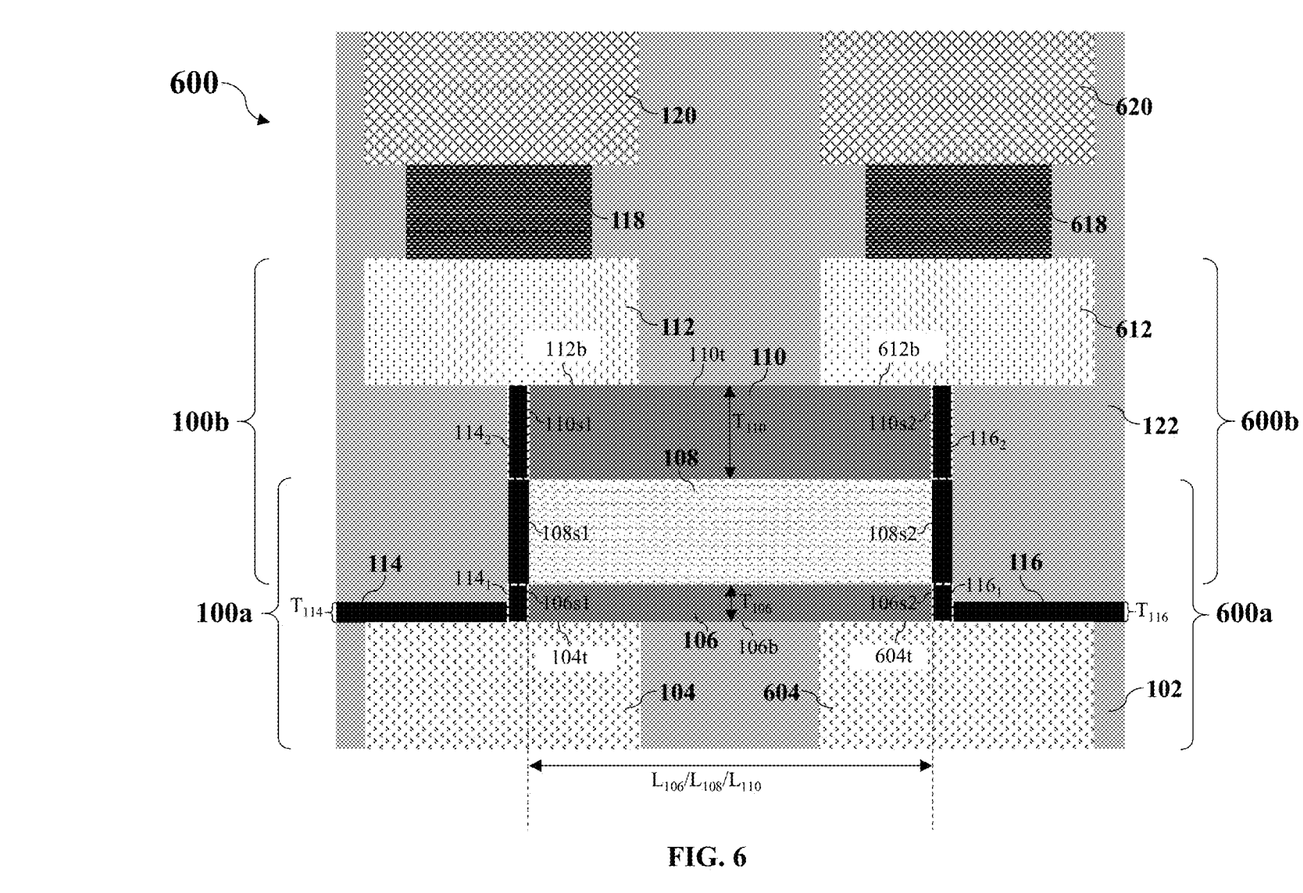
FIG. 6 shows a simplified cross-sectional view of a memory device according to alternative non-limiting embodiments.

FIG. 6 shows a memory device 600 according to alternative non-limiting embodiments. The memory device 600 is similar to the memory device 100, and thus, the common features are labelled with the same reference numerals and need not be discussed.

As compared to the memory device 100, the memory device 600 may additionally include a third memory cell 600a and a fourth memory cell 600b. In particular, the third memory cell 600a may include a fourth electrode 604 at least partially arranged within the base layer 102 and the fourth memory cell 600b may include a fifth electrode 612 at least partially arranged within the insulating layer 122. As shown in FIG. 6, the first mask element 106 may be arranged over a portion of and laterally offset from the fourth electrode 604, and the fifth electrode 612 may be arranged over a portion of and laterally offset from the second mask element 110. In particular, the bottom surface 106b of the first mask element 106 may partially overlap and optionally directly contact the fourth electrode 604, and the top surface 110t of the second mask element 110 may partially overlap and optionally directly contact the fifth electrode 612.

The further switching layer 116 may be arranged between the fourth electrode 604 and the fifth electrode 612. In particular, the further switching layer 116 may extend substantially planar between the top surface 604t of the fourth electrode 604 and the bottom surface 612b of the fifth electrode 612, along the substantially vertically aligned second side surfaces 106s2, 108s2, 110s2 of the first mask element 106, the second electrode 108 and the second mask element 110. The further switching layer 116 may also extend horizontally over the top surface 604t of the fourth electrode 604 away from the first mask element 106. Thus, the first mask element 106 may overlap with a portion of the top surface 604t of the fourth electrode 604 and the further switching layer 116 may overlap with the entire remaining portion of the top surface 604t of the fourth electrode 604. The third memory cell 600a may further include a first part $116_1$ of the further switching layer 116 (between the fourth electrode 604 and the second electrode 108), and the fourth memory cell 600b may further include a second part $116_2$ of the further switching layer 116 (between the fifth electrode 612 and the second electrode 108).

The fourth electrode 604 may be laterally spaced apart from the first electrode 104, or in other words, a part of the base layer 102 (including insulating material) may be arranged between the first electrode 104 and the fourth electrode 604. Similarly, the fifth electrode 612 may be laterally spaced apart from the third electrode 112, or in other words, a part of the insulating layer 122 (including insulating material) may be arranged between the third electrode 112 and the fifth electrode 612. Therefore, the fourth electrode 604 and the first electrode 104 may be electrically isolated from each other, and the fifth electrode 612 and the third electrode 112 may be electrically isolated from each other. In other words, the first and second memory cells 100a, 100b may be electrically isolated from the third and fourth memory cells 600a, 600b.

The memory device 600 may include a further connector 618 and a further contact 620 arranged at least partially within the insulating layer 122. The further connector 618 may electrically connect the further contact 620 with the fifth electrode 612. In particular, the further connector 618 may be arranged between and may adjoin the further contact 620 and the fifth electrode 612. The further connector 618 and the further contact 620 may include conductive material, such as, but not limited to, aluminum, copper, tungsten, alloys thereof, or combinations thereof. For example, the further contact 620 may include a further conductive line, such as, but not limited to, a further bit line of the memory device 600 and the further connector 618 may include a conductive via.

Similar to the first memory cell 100a, the third memory cell 600a may be an oxide-based memory cell, and similar to the second memory cell 100b, the fourth memory cell 600b may be a conductive-bridge memory cell. The fourth electrode 604 may include an oxygen scavenging electrode of the third memory cell 600a. In particular, the fourth electrode 604 may include oxygen scavenging material, such as, but not limited to, titanium (Ti), tantalum (Ta), aluminum (Al), alloys thereof, or combinations thereof. The fifth electrode 612 may include an active electrode of the fourth memory cell 600b. In particular, the fifth electrode 612 may include metal material, such as, but not limited to, silver (Ag), copper (Cu), nickel (Ni), alloys thereof, or combinations thereof. As described above, the further switching layer 116 may include a same material throughout. In other words, the first part $116_1$ of the further switching layer 116 and the second part $116_2$ of the further switching layer 116 may include a same material.

The first and second memory cells 100a, 100b may form a first memory unit of the memory device 600, and the third and fourth memory cells 600a, 600b may form a second memory unit of the memory device 600. The first memory unit may operate in a similar manner as the memory device 100. In particular, the first memory unit may be switchable between the states "01", "11", "10" when the first, second and third write voltage differences $V_{01}$, $V_{11}$, $V_{10}$ are respectively applied between the first and third electrodes 104, 112. The second memory unit may also operate in a similar manner as the memory device 100, except that the write voltage differences may instead be applied between the fourth and fifth electrodes 604, 612. In particular, the second memory unit may also be switchable between the states "01", "11", "10" when the first, second and third write voltage differences $V_{01}$, $V_{11}$, $V_{10}$ are respectively applied between the fourth and fifth electrodes 604, 612. The first and second memory units may be switchable between the "01", "11", "10" states independently of each other. Therefore, as compared to the memory device 100, by further providing the fourth and fifth electrodes 604, 612, the memory device 600 may be similarly compact but with a greater storage capacity.

Figure 7:
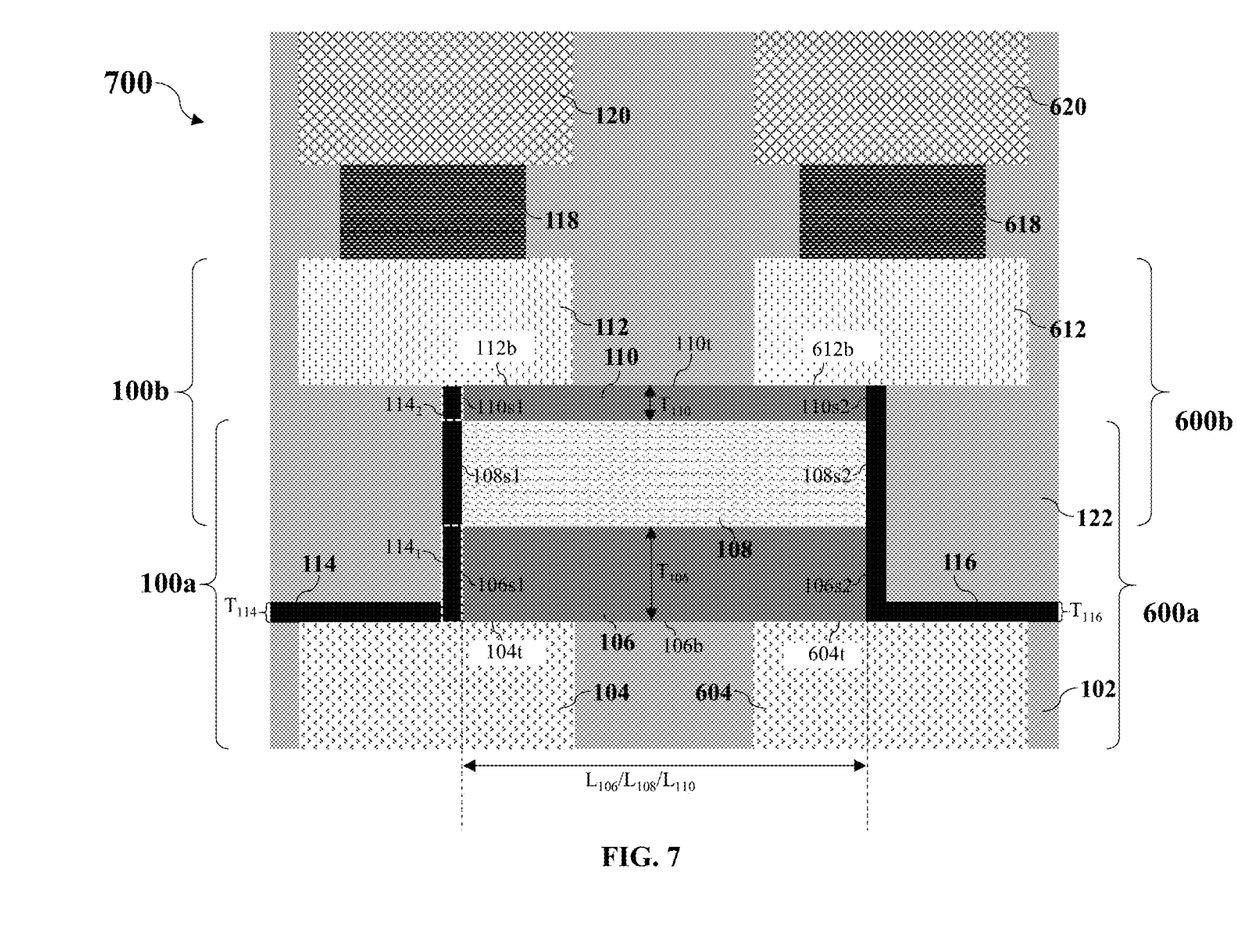
FIG. 7 shows a simplified cross-sectional view of a memory device according to alternative non-limiting embodiments.

FIG. 7 shows a memory device 700 according to alternative non-limiting embodiments. The memory device 700 is similar to the memory device 600, and thus, the common features are labelled with the same reference numerals and need not be discussed.

The memory device 700 may similarly include a first memory unit including the first and second memory cells 100a, 100b and a second memory unit including the third and fourth memory cells 600b, 600b. However, the first and third memory cells 100a, 600a may instead be conductive-bridge memory cells, and the second and fourth memory cells 100b, 600b may instead be oxide-based memory cells. Further, a thickness $T_{110}$ of the second mask element 110 may be less than a thickness $T_{106}$ of the first mask element 106. The thicknesses $T_{106}$, $T_{110}$ of the first and second mask elements 106, 110 may be approximately equal to that of the mask elements 106, 110 in the memory device 500. In use, each of the first and second memory units of the memory device 700 may operate in a similar manner as the memory device 500 as described above. In particular, the first and second memory units may be switchable between the "01", "11", "10" states independently of each other by applying first, second and third write voltage differences $V_{01}$, $V_{11}$, $V_{10}$ between the first and third electrodes 104, 112 for the first memory unit and between the fourth and fifth electrodes 604, 612 for the second memory unit. Therefore, as compared to the memory device 500, by further providing the fourth and fifth electrodes 604, 612, the memory device 700 may be similarly compact but with a greater storage capacity.

The thicknesses $T_{106}$, $T_{110}$ of the first and second mask elements 106, 110 in the memory devices 600, 700 may alternatively be approximately equal. Further, the memory cells 100a, 100b in the first memory unit may instead be of a same type (oxide-based memory cell or conductive-bridge memory cell) and similarly, the memory cells 600a, 600b in the second memory unit may instead be of a same type (oxide-based memory cell or conductive-bridge memory cell). In this alternative non-limiting embodiment, the memory cells 100a, 100b, 600a, 600b in different memory units may be of a same type or be of different types. Further, each memory unit may operate in a similar manner as that described above with respect to a memory device having the first and second memory cells 100a, 100b of the same type.

Figure 8:
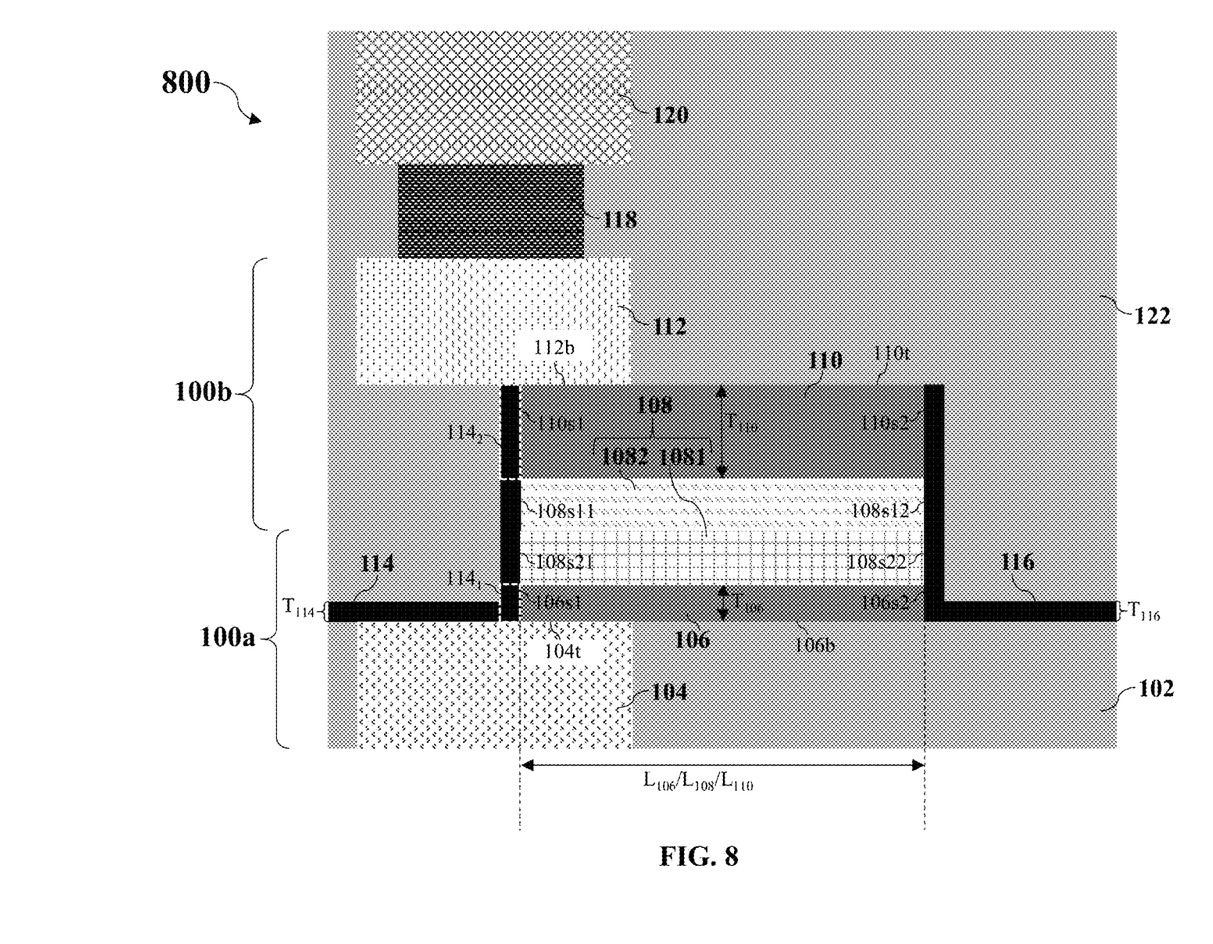
FIG. 8 shows a simplified cross-sectional view of a memory device according to alternative non-limiting embodiments.

FIG. 8 shows a memory device 800 according to alternative non-limiting embodiments. The memory device 800 is similar to the memory device 100, and thus, the common features are labelled with the same reference numerals and need not be discussed.

As compared to the memory device 100, the second electrode 108 of the memory device 800 may instead include a first electrode layer 1081 and a second electrode layer 1082 arranged over the first electrode layer 1081. The first electrode layer 1081 and the second electrode layer 1082 may include different materials.

As shown in FIG. 8, the first memory cell 100a may include the first electrode 104, the first electrode layer 1081 and the first part $114_1$ of the switching layer 114, and the second memory cell 100b may include the third electrode 112, the second electrode layer 1082 and the second part $114_2$ of the switching layer 114. The first electrode layer 1081 may include an inert electrode of the first memory cell 100a and the second electrode layer 1082 may include an inert electrode of the second memory cell 100b, where the first and second electrode layers 1081, 1082 may include different inert electrode materials. The inert electrode materials may include platinum (Pt), ruthenium (Ru), gold (Au), alloys thereof, or combinations thereof, or any other inert electrode materials as known to those skilled in the art.

Alternatively, the first and third electrodes 104, 112 may include inert electrodes of the first and second memory cells 100a, 100b respectively; whereas, the first electrode layer 1081 may include an oxygen scavenging electrode of the first memory cell 100a and the second electrode layer 1082 may include an active electrode of the second memory cell 100b. The first and third electrodes 104, 112 may include a same or different inert electrode material. The first electrode layer 1081 may include oxygen scavenging material, such as, but not limited to, titanium (Ti), tantalum (Ta), aluminum (Al), alloys thereof, or combinations thereof, and the second electrode layer 1082 may include metal material, such as, but not limited to, silver (Ag), copper (Cu), nickel (Ni), alloys thereof, or combinations thereof.

In the memory devices 500-700 and the memory devices having memory cells 100a, 100b/600a, 600b of the same type as described above, the second electrode 108 may similarly include first and second electrode layers 1081, 1082 including different materials. For example, in the memory device 500, the second electrode 108 may include first and second electrode layers 1081, 1082. The first electrode layer 1081 may include an active electrode of the first memory cell 100a, the second electrode layer 1082 may include an oxygen scavenging electrode of the second memory cell 100b, and the first and third electrodes 104, 112 may include inert electrodes of the first and second memory cells 100a, 100b respectively.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a first electrode;
   a first mask element arranged over a portion of and laterally offset from the first electrode;
   a second electrode arranged over the first mask element;
   a second mask element arranged over the second electrode;
   a third electrode arranged over a portion of and laterally offset from the second mask element; and
   a switching layer arranged between the first electrode and the third electrode, along a first side surface of the first mask element, a first side surface of the second electrode and a first side surface of the second mask element.

2. The memory device of claim 1, wherein the switching layer comprises:
   a first part between the first electrode and the second electrode; and
   a second part between the second electrode and the third electrode;
   wherein the first part and the second part comprise a same material.

3. The memory device of claim 1, wherein the second electrode adjoins the first mask element and the second mask element adjoins the second electrode.

4. The memory device of claim 1, wherein the second electrode comprises an inert electrode.

5. The memory device of claim 1, wherein the first electrode and the third electrode comprise different materials.

6. The memory device of claim 1, wherein the first electrode and the third electrode comprise a same material.

7. The memory device of claim 1, wherein a thickness of the second mask element is greater than a thickness of the first mask element.

8. The memory device of claim 1, wherein a thickness of the first mask element is greater than a thickness of the second mask element.

9. The memory device of claim 1, wherein a thickness of the first mask element is approximately equal to a thickness of the second mask element.

10. The memory device of claim 1, wherein the memory device comprises a first memory cell comprising the first electrode and the second electrode, and a second memory cell comprising the third electrode and the second electrode.

11. The memory device of claim 10, wherein the first memory cell is an oxide-based memory cell and the second memory cell is a conductive-bridge memory cell.

12. The memory device of claim 10, wherein the first memory cell is a conductive-bridge memory cell and the second memory cell is an oxide-based memory cell.

13. The memory device of claim 10, wherein the first memory cell and the second memory cell are a same type of memory cell comprising one of a conductive-bridge memory cell and an oxide-based memory cell.

14. The memory device of claim 10, wherein the second electrode comprises:
   a first electrode layer; and
   a second electrode layer arranged over the first electrode layer;
   wherein the first memory cell comprises the first electrode and the first electrode layer of the second electrode, and the second memory cell comprises the third electrode and the second electrode layer of the second electrode; and wherein the first electrode layer and the second electrode layer comprise different materials.

15. The memory device of claim 14, wherein the first electrode layer comprises an oxygen scavenging electrode of the first memory cell and the second electrode layer comprises an active electrode of the second memory cell.

16. The memory device of claim 1, further comprising a further switching layer arranged along a second side surface of the first mask element, a second side surface of the second electrode and a second side surface of the second mask element.

17. The memory device of claim 16, further comprising:
a fourth electrode, wherein the first mask element is arranged over a portion of and laterally offset from the fourth electrode; and
a fifth electrode arranged over a portion of and laterally offset from the second mask element;
wherein the further switching layer is arranged between the fourth electrode and the fifth electrode.

18. The memory device of claim 17, wherein the second side surfaces of the first mask element, the second electrode and the second mask element face an opposite direction from the first side surfaces of the first mask element, the second electrode and the second mask element, respectively.

19. A method of fabricating a memory device, the method comprising:
forming a first electrode;
forming a first mask element over a portion of the first electrode, wherein the first mask element is laterally offset from the first electrode;
forming a second electrode over the first mask element;
forming a second mask element over the second electrode;
forming a third electrode over a portion of the second mask element, wherein the third electrode is laterally offset from the second mask element; and
forming a switching layer between the first electrode and the third electrode, along a first side surface of the first mask element, a first side surface of the second electrode and a first side surface of the second mask element.

20. The method of claim 19, wherein forming the switching layer comprises:
depositing switching material over the second mask element; and
removing a portion of the switching material above the second mask element.

\* \* \* \* \*